United States Patent
Claiborne et al.

(10) Patent No.: US 6,180,990 B1
(45) Date of Patent: Jan. 30, 2001

(54) HYPERSPECTRAL RADIATION DETECTOR

(75) Inventors: Lewis T. Claiborne, Richardson, TX (US); Brian Allen Gorin, Setauket, NY (US); Henry Garton Lewis, Jr., Tom River, NJ (US)

(73) Assignee: Lockheed Martin Corporation, Bethesda, MD (US)

( * ) Notice: Under 35 U.S.C. 154(b), the term of this patent shall be extended for 0 days.

(21) Appl. No.: 09/277,694

(22) Filed: Mar. 26, 1999

(51) Int. Cl.$^7$ ................................................. H01L 31/0352
(52) U.S. Cl. .................... 257/440; 257/21; 250/338.4; 250/339; 250/370.14
(58) Field of Search ..................... 257/440, 443, 257/21; 250/338.1, 338.4, 339, 370.08, 370.14, 339.02

(56) References Cited

U.S. PATENT DOCUMENTS

| | | | |
|---|---|---|---|
| 3,962,578 | 6/1976 | Roschen | 250/226 |
| 4,596,930 | 6/1986 | Steil et al. | 250/332 |
| 4,625,389 | 12/1986 | Readhead | 29/572 |
| 4,822,998 | 4/1989 | Yokota et al. | 250/226 |
| 4,956,555 | 9/1990 | Woodberry | 250/339 |
| 5,013,918 | 5/1991 | Choi | 250/338.4 |
| 5,023,944 | 6/1991 | Bradley | 455/611 |
| 5,157,258 | 10/1992 | Gunning, III et al. | 250/339 |
| 5,198,659 | 3/1993 | Smith et al. | 250/214.1 |
| 5,329,136 | 7/1994 | Goossen | 257/17 |

(List continued on next page.)

OTHER PUBLICATIONS

Scott D. Briles; Evaluation of Onboard HYperspectral Image Compression Techniques for a Parallel Push–Broom Sensor; report; Apr. 8, 1996; pp. 1–11.

Gregory E. TerrrE; Applications of Hyperspectral Data in Coastal Marine Environments; Thesis; Nov. 17, 1995; pp. 1–51.

Yudi AdityAwarman et al.; Performance Modeling of Hyperspectral Imaging Sensors for Atmospheric Studies; Technical Report; Sep. 1994; pp. 1–25.

R. Basedow et al.; The Hydice Instrument Design and It's Application to Planetary Instruments; Abstract; Apr. 1993; p. 1.

Alksandar Zavaijevski et al.; Adaptive Mutlilevel Classification and Detection in Multispectral Images; *Optical Engineering*, Oct. 1996, p. 2884–2893; vol. 35, No. 10.

(List continued on next page.)

*Primary Examiner*—David Hardy
(74) *Attorney, Agent, or Firm*—Sidley & Austin; Stephen S. Sadacca

(57) ABSTRACT

A hyperspectral radiation detector system collects infrared radiation concurrently from a plurality of adjacent infrared spectral bands. A collector system includes an optical train for receiving the incoming radiation, a disperser for separating the received infrared radiation into multiple adjacent bands of interest and a focal plane array for detecting the individual infrared bands and producing corresponding output signals. The focal plane array is an enhanced quantum well infrared photodetector having multiple physical dimensions of each detector varied in a predetermined manner to alter the frequency of responsivity of the detector to form the multi-band pixels of the received image. The output signals from the array can be processed as required to review selected bands of interest or to determine if certain types of targets are present within the received radiation. The system can be coupled to ground control or other platforms for receiving collection control commands and for returning collected data which may be in compressed form.

6 Claims, 6 Drawing Sheets

U.S. PATENT DOCUMENTS

| | | | |
|---|---|---|---|
| 5,379,065 | 1/1995 | Cutts | 348/269 |
| 5,384,469 | 1/1995 | Choi | 257/21 |
| 5,420,681 | 5/1995 | Woodruff | 356/326 |
| 5,444,236 | 8/1995 | Lundington et al. | 250/208.1 |
| 5,539,206 | 7/1996 | Schimert | 250/338.4 |
| 5,543,628 | 8/1996 | Chow et al. | 257/17 |
| 5,552,603 | 9/1996 | Stokes | 250/338.4 |
| 5,646,421 | 7/1997 | Liu | 257/21 |
| 5,773,831 * | 6/1998 | Brouns | 257/21 |

OTHER PUBLICATIONS

P.C. Pinet; Spectroscopic Imaging of Solid Planetary Surfaces; *SD Optical Spectroscopic Methods in Astronomy*; ASP Conference Series; 1995; p. 294–297; vol. 71.

Peter SilverglAte et al.; Concepts for Spaceborne Hyperspectral Imagery using Prism Spectrometers; Advanced Microdevices and Space Science Sensors—Symposium; Jul. 1994; p. 112–120; vol. 2267; The InternationAL Society for Optical Engineering.

O. Saint–Pe et al.; Development of a 2–D Array foR 1 to 2.35 um Hyperspectral Imager; Infrared Detectors for Remote Sensing: Physics, Materials, and Devices—Symposium; Aug. 1996; p. 138–149; vol. 2816; The International Society for Optical Engineering.

Charles T. Willoughby et al.; Hyperspectral Imaging Payload for the NASA Small Satellite Technology Initiative Program; 1996; p. 1–12.

M.J. Dahlin et al.; Development of High Speed IR Sensor Chip Technologies; Infrared Readout Electronics III—Symposium; Apr. 1996; p. 22–39; vol. 2745; The International Society for Optical Engineering.

N.S. Gluck et al; Two–Color Imaging by the Use of Patterned Optical Filters Bonded to Focal–Plane–Array Detectors; *Applied Optics*; Oct. 1, 1996; p. 5520–5523; vol. 35, No. 28.

Paul L. McCarley et al.; NeuroSeek Dual–Color Image Processing Infrared Focal Plane Array; Infrared Readout Electronics IV—Symposium; Apr. 1998; p. 13–27; vol. 3360; The International Society for Optical Engineering.

Meimei Z. Tidrow; Multicolor Quantum Well Infrared Photodetectors; 1998, p. 1–8.

H.C. Liu et al.; Multicolor Voltage–Tunable Quantum–Well Infrared Photodetector; *Electron Device Letters*; Dec. 1993; p. 566–568; vol. 14, No. 12.

* cited by examiner

HYPERSPECTRAL RADIATION DETECTOR

TECHNICAL FIELD OF THE INVENTION

The present invention pertains in general to radiation detectors, such as for infrared radiation, and in particular to such detectors, and systems which include such detectors, used for the simultaneous detection of multiple bands of radiation.

BACKGROUND OF THE INVENTION

The term "hyperspectral imaging" refers to the concurrent collection of radiation for multiple, adjacent spectral radiation bands to detect a target, which may be subpixel in size. The collection of radiation with different wavelengths at one time can provide greater information about whatever is present within the field of view, in particular it can make possible the detection of subpixel targets when the data is processed with appropriate algorithms. This is also referred to as the ability to image a scene in many spectral colors simultaneously. Hyperspectral detectors are frequently designed to operate in the infrared range of radiation. Such detectors have been designed to collect several hundred adjacent bands of radiation at one time.

The wide bandwidth radiation is collected by detectors which are sensitive to each of the bands of radiation. One method of separating the radiation by wavelength is by use of a prism. A further method of separation is accomplished by use of a diffraction grating.

Second generation photovoltaic mercury cadmium telluride (MCT) is difficult to manufacture in large two-dimensional arrays. In general it has poor uniformity, an excess of outages, and does not maintain the gain and offset calibration required for a hyperspectral detector system. As a result, it does not meet the requirements for a longwave infrared (LWIR) long range standoff targeting/surveillance system. Quantum Well Infrared Photodetectors (QWIPS) have an external Quantum Efficiency (QE) of approximately four percent (4%). This is a product of the internal quantum efficiency and the photoconductive gain. This value of QE is generally insufficient for a targeting/surveillance system which would operate at a range of up to approximately fifty (50) nautical miles.

An enhanced quantum well infrared photodetector is described in U.S. Pat. No. 5,539,206. This patent describes an infrared detector which includes a plurality of detector pixels, each of which comprises a plurality of elongate quantum well infrared radiation absorbing photoconductor elements. This photodetector, however, receives only one band of infrared radiation at one time.

The detectors which collect the desired radiation must be manufactured to be particularly sensitive for each of the desired radiation bands of interest. Such detectors are therefore complex and difficult to manufacture at a reasonable cost. The present invention is directed to an improved hyperspectral detector and system which can provide improved targeting and surveillance at long ranges, such as 50 nautical miles.

SUMMARY OF THE INVENTION

A selected embodiment of the present invention is a hyperspectral quantum well infrared radiation photodetector which includes an array of detectors, the array having an X-dimension (rows) and a Y-dimension (columns), wherein the detectors in each row have a common wavelength band of infrared radiation response and the detectors in each column have multiple wavelength bands of infrared radiation response. Each detector comprises a plurality of elongate, multiple quantum well infrared radiation absorbing elements, each element has a width dimension and, the center-to-center position of adjacent elements are separated by a pitch dimension. Each of the elements has first and second opposite longitudinal surfaces. The detectors in each of the columns have multiple width dimensions and multiple pitch dimensions to produce detectors having the multiple wavelength bands of infrared radiation response and the detectors in each of the rows have common width and pitch dimensions to produce a common wavelength band of infrared radiation response. The multiple quantum infrared elements comprise a diffraction grating for the infrared radiation. The first contact for each detector includes a plurality of planar electrically interconnected strips respectively in contact with and extending along the first surfaces of the multiple quantum well elements. A second contact for each detector is electrically connected to the second surfaces of the multiple quantum well elements. The first contact and the second contact for each detector are positioned on opposite longitudinal sides of each of the multiple quantum well elements to provide current flow through the elements in a direction substantially transversed to the axis of the elements. A planar reflector for the infrared radiation is positioned on an opposite side of the second contact from the multiple quantum well elements. The combined diffraction grating structure with the planar reflector and contact layers form a resonant optical cavity which captures the infrared radiation with the designated bandwidth.

BRIEF DESCRIPTION OF THE DRAWINGS

For a more complete understanding of the present invention and the advantages thereof, reference is now made to the following description taken in conjunction with the accompanying drawings in which.

DETAILED DESCRIPTION

Figure 1:
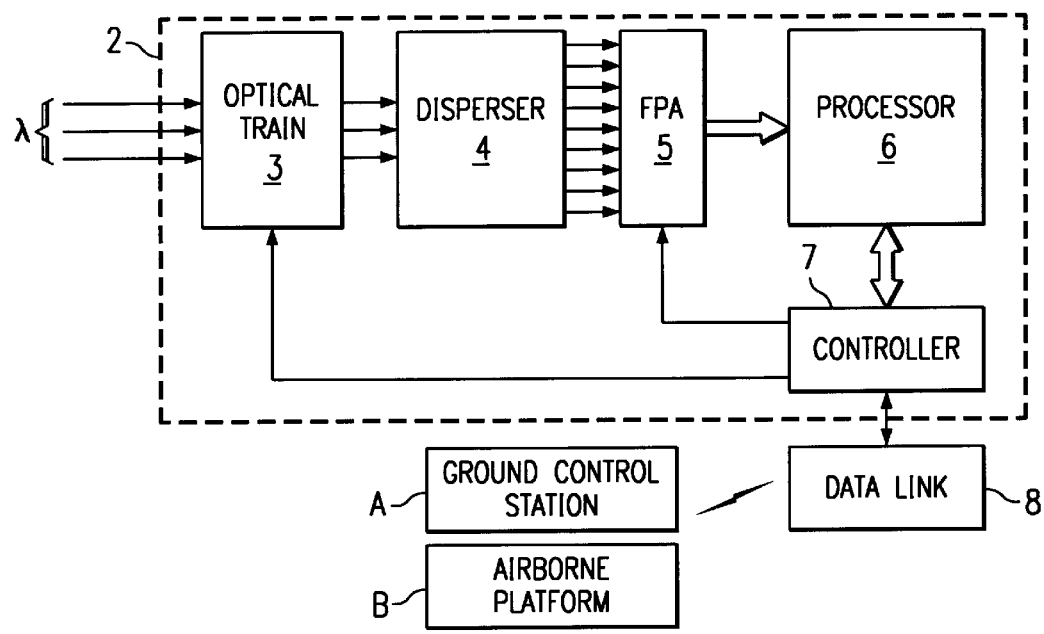
FIG. 1 is a block diagram of a hyperspectral long wave infrared (LWIR) sensor system in accordance with the present invention.
Figure 3:
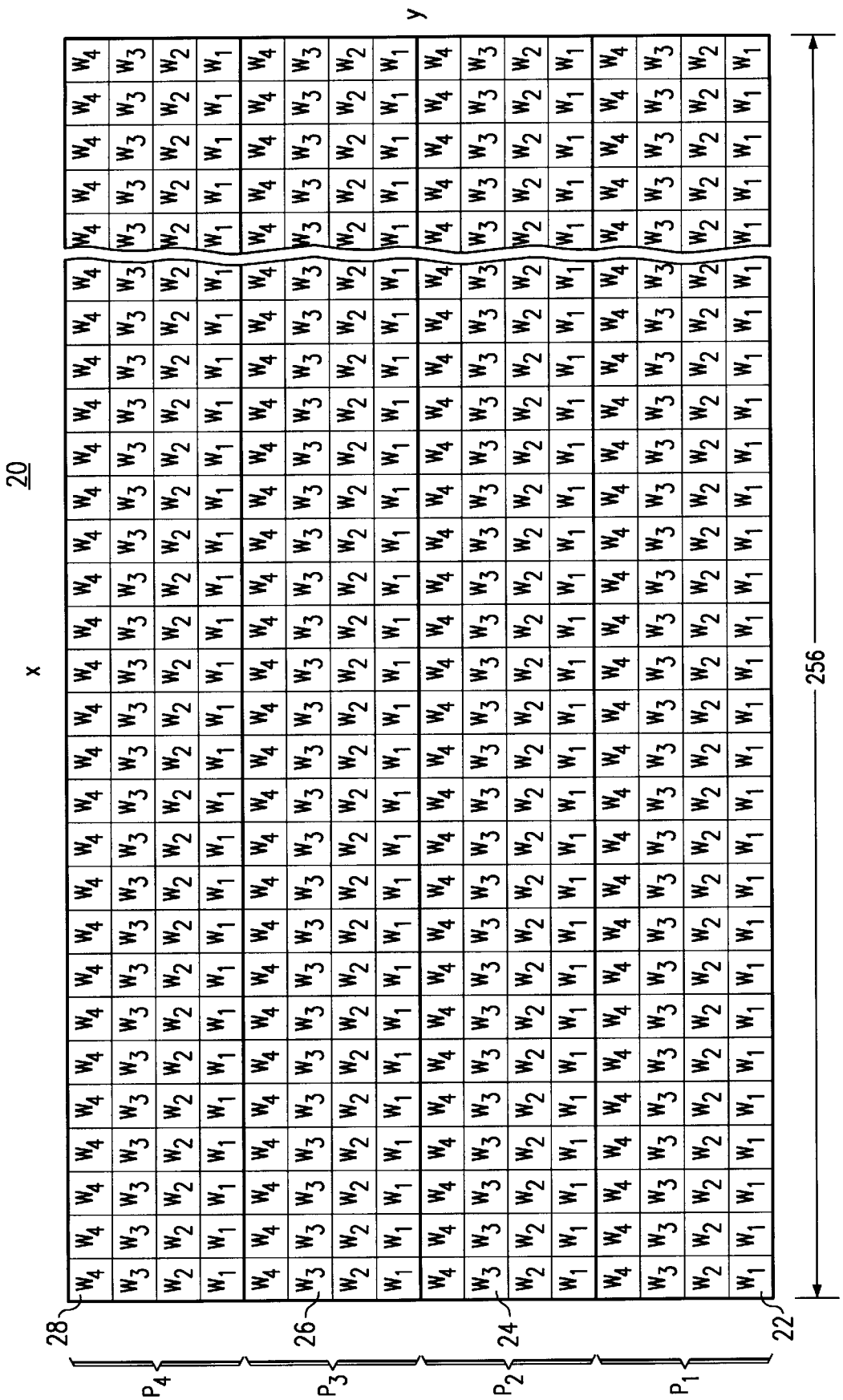
FIG. 3 is a schematic layout description for a hyperspectral infrared detector in accordance with the present invention having four pitch dimension regions with each pitch region having four width dimensions.

FIG. 1 illustrates a preferred system embodiment for the present invention. A system 2 comprises a collection of operative elements which work in conjunction to collect, detect and process infrared radiation, which is represented by the symbol λ (lambda). The infrared radiation is received by an optical train 3 which comprises a steerable group of lenses which collect and focus infrared radiation. The radiation collected by the optical train 3 is passed to a disperser 4 which may comprise either a diffraction grating or a compensated prism assembly. The function of the disperser 4 is to separate the received infrared radiation into its spectral components. The output from the disperser 4 is provided to a focal plane array 5 which is preferably an enhanced quantum well infrared photodetector (EQWIP) as illustrated in FIG. 3. The array 5 serves to sense each of the spectral bands of radiation produced by the disperser 4 and to generate a corresponding signal output which is provided to a processor 6, which is preferably a heterogenous digital signal processor (DSP) system which can be expanded to have hundreds of individual DSPs. A representative commercial product for the processor 6 is a Mercury Raceway. The Mercury Raceway processor is supplied by Mercury Computer Systems Inc., which is located at 199 Rivemeck Road, Chelmsford, Mass. 01824-2820.

The system 2 includes a controller 7 which is connected by a bidirectional bus to the processor 6, through control lines to the array 5 for activating and directing the operation of the array and through control lines to the optical train 3 for providing electromechanical control signals.

The controller 7 is connected through a bidirectional data path to a data link 8 which includes a radio frequency transmitter and receiver for connecting the data link to a ground control station A or to an airborne platform B. The system 2 together with a data link 8 preferably are carried in a vehicle such as an aircraft for providing surveillance and/or target detection over a very wide area and at distances which can range up to fifty (50) nautical miles.

Figure 2:
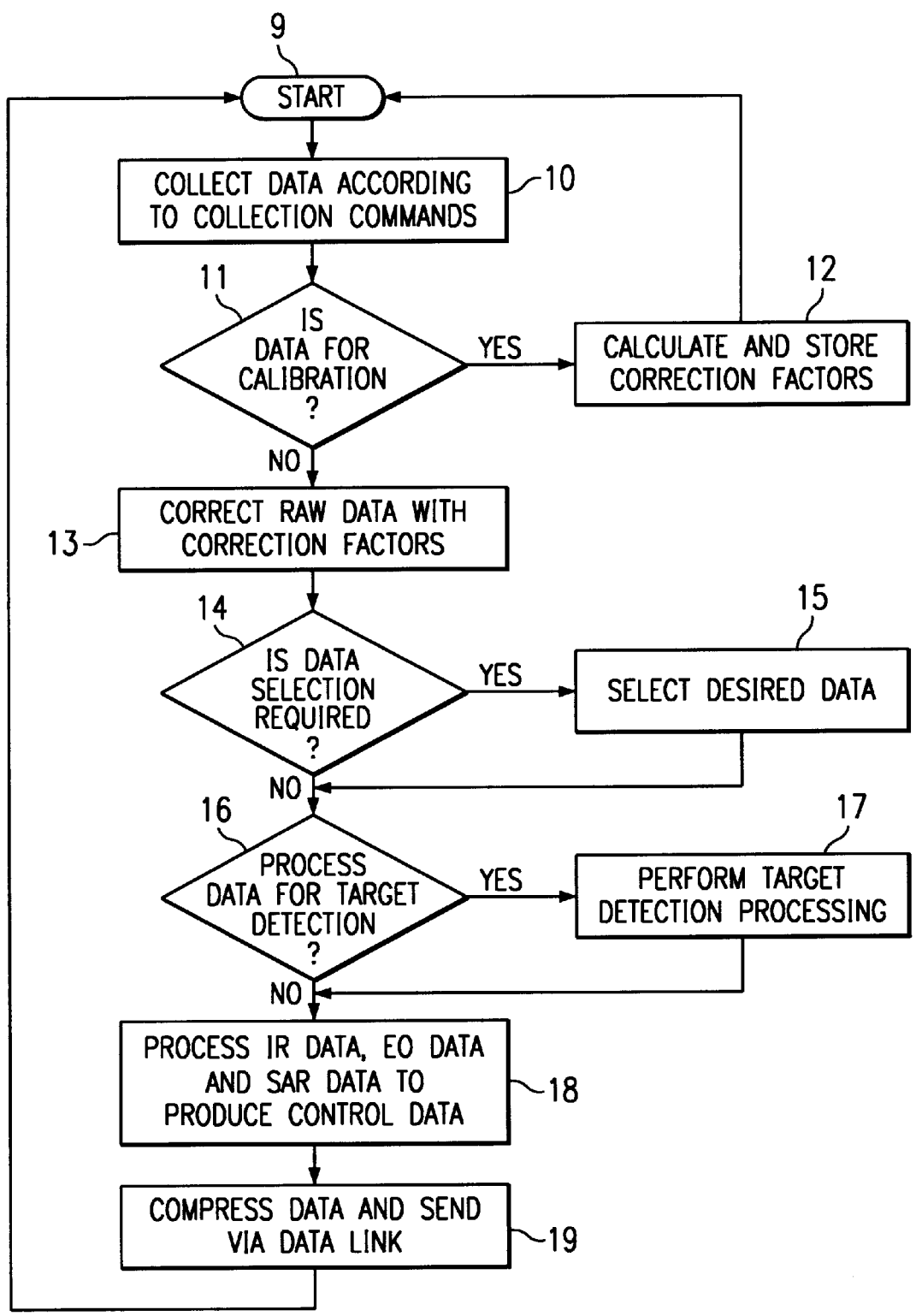
FIG. 2 is a flow diagram illustrating data collection, processing and transfer.

The sequence of operations for the system 2 which is illustrated in FIG. 1 are shown in a flow diagram illustrated in FIG. 2. At the start 9 of operations, block 10 is implemented to collect data according to collection commands which have been provided to the system from either the ground control station A or another airborne platform B. These commands include identification of particular spectral bands that are to be aggregated by the processor 6 and to eliminate the particular spectral bands which have statistics indicating that there is no signal of interest or have a low signal to noise ratio. The command signals can also include directions to perform target processing.

After the operations in block 10 have been completed, transfer is made to a question block 11 to determine if the data currently being collected is for the purpose of calibration. If so, control is transferred to block 12 to calculate correction factors for the received raw data and to store these correction factors for later use. Such correction factors are determined by the non-uniformity in response of the focal plane array. Examples of aspects which are subject to the correction factors are detector response gain and offset. Control is then returned to the start 9. If the data is not used for the purpose of calibration, it is to be processed and analyzed. Control is therefore transferred from the block 11 to block 13 in which the raw data is corrected with the previously stored correction factors.

After the data has been subject to correction, control is transferred to a question block 14 to determine if a command has been made to select particular data. If so, entry is made to block 15 to select only that data which is desired for the current collection operation. Control is then transferred to the input of question block 16. If there is no particular data selection required, control is transferred directly to the input of block 16.

Within the question block 16, a determination is made if the data should be processed for target detection. If so, control is transferred to block 17 wherein target detection processing is performed. Target detection processing is performed as described in hyperspectral image processing reference.

Both the NO output of question block 16 and the sequential output from block 17 result in a transfer to the input of block 18 wherein specific processing is performed on the received infrared data that has been collected by the system 2, electro optical (EO) data which has been collected by a separate sensor and/or synthetic aperture radar (SAR) data which has also been collected by a separate sensor. This data, individually, or in combination, is utilized to produce control data that is used by the controller 7 to direct the operations of the optical train 3, as well as the array 5.

Following block 18, entry is made to operation block 19 to compress the data that has been produced and to send the compressed data via the data link 8 to a selected location such as the ground control station A or to an airborne platform B.

The operation block 19 is optional but it may be used to compress target data, aggregate multi spectral bank data or hyperspectral band data before such information is transmitted through the data link to the ultimate location.

U.S. Pat. No. 5,539,206 entitled "Enhanced Quantum Well Infrared Photodetector", Ser. No. 425,598, filed Apr. 20, 1995 and issued Jul. 23, 1996, is incorporated herein by reference. The infrared detector structure shown in this patent utilizes elongate photoconductor elements. These elements are spaced apart by a common pitch distance and the elements have a common width.

One aspect of the present invention is directed to an infrared focal plane array detector structure in which the wavelength responsivity for different portions of the focal plane array is varied by altering the physical dimensions of the detector structure for different sections of the focal plane array. The principle physical dimensions to be altered are the pitch, which is the distance between the center lines of the detector elements, and the width of each of the detector elements. By changing these physical dimensions, each portion of the detector having selected dimensions is tuned to be responsive to a particular band of infrared radiation.

Referring now to FIG. 3, there is shown a schematic representation for a first embodiment of the present invention for a hyperspectral detector array 20 in accordance with the present invention. The detector array 20 comprises an array of individual detectors (pixels). The array has 256 columns and 16 rows, thus there are 4,096 detectors in the entire array. The array is divided into four pitch regions designated as $P_1$, $P_2$, $P_3$, and $P_4$. Each of the detectors within each of the pitch regions has the same pitch, that is, the center-to-center spacing between elongate detector elements. This is for both horizontal and vertical pitch. The detectors within each column have multiple widths (i.e., the width of the elongate detector elements) that are designated by the terms $w_1$, $w_2$, $w_3$, and $w_4$. Note that the four widths are present within each of the pitch sections. In the far left column, certain detectors are designated as 22, 24, 26 and 28.

Within the detector array 20, the width dimension is the same throughout each row of detectors. The detector photoconductor elements in each row have the same width dimension, that is, either $w_1$, $W_2$, $W_3$, or $w_4$. Each detector within the detector array 20 can be characterized by the pitch value and width value for its photodetector elements. For example, detector 22 is characterized by $P_1$, $w_1$. Element 24 is characterized by the combination $P_2$, $w_3$, and element 28 is characterized by $P_4$, $w_4$, Note in each column (y-dimension) that each detector has a unique combination of pitch and width. These values can be selected such that each detector in a column is responsive to a different band of infrared radiation.

Figure 4:
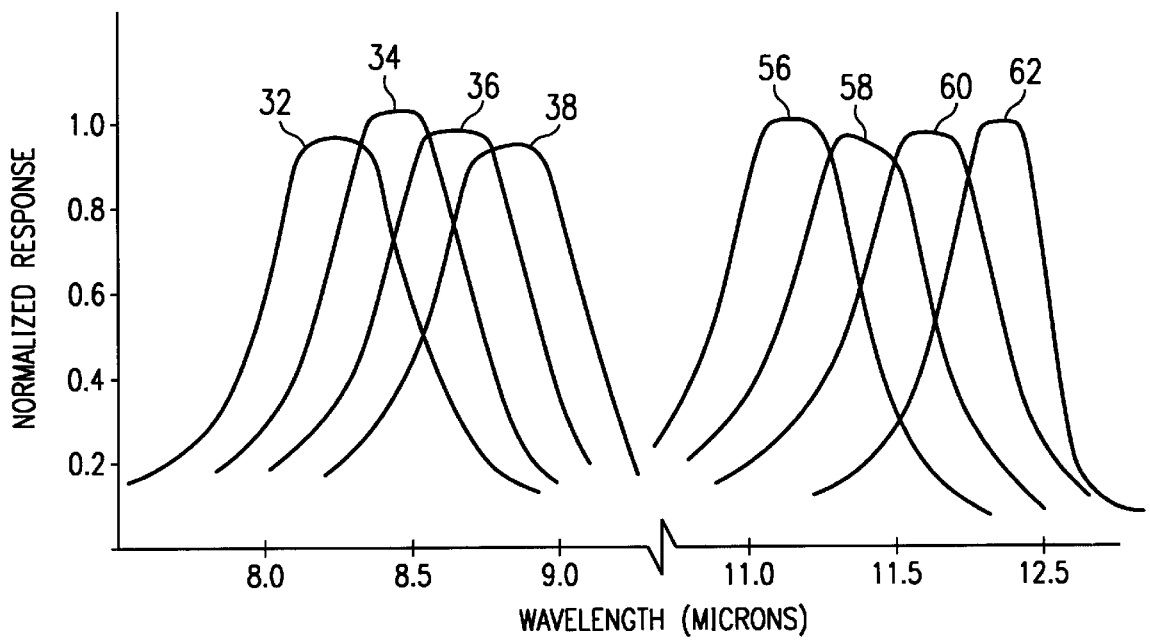
FIG. 4 is a representation of the infrared responsivity of a hyperspectral detector in accordance with the present invention having sixteen detector bands tuned individually across the 8–12 micron infrared band.

As shown in FIG. 4, the detector array 20 can be designed to have a response that extends over the infrared range of 8–12 microns with uniform spacing of the individual detector responses. In FIG. 4, there are shown individual response curves for the 8–9 micron wavelenght range, 32, 34, 36, and 38, in a first group and for the 11–12 micron wavelength range 56, 58, 60, and 62 in a last group. There are similar response curves for the 9–10 and 10–11 wavelength ranges for a total of 16. These 16 response curves correspond respectively to the 16 detectors in the left hand column shown in FIG. 3 starting with element 22 and ending with element 28. For example, the detector in the far left column characterized by $P_1$, $w_4$ has the response curve 38. Therefore, it can be seen that the detector array 20 has individual detectors for each of 16 bands as represented in FIG. 4.

The x-dimension (rows) provide a linear dimension for the field of view and with the movement of this linear dimension over the field of view, a two dimensional image can be produced by periodically sampling each of the detectors within the detector array 20. Each column essentially corresponds to a pixel element of the scene, but with 16 contiguous bands of infrared information being collected substantially at one time, thereby providing much greater information about what is present within the field of view, in contrast to collecting only a single band of radiation.

A nominal set of values for the pitch and width dimensions for the detectors shown in FIG. 3 are as follows:
$P_1$=7 microns; $P_2$=7.5 microns; $P_3$=8.0 microns; $P_4$=8.5 microns
$w_1$=1.0 microns; $w_2$=1.2 microns; $w_3$=1.4 microns; $w_4$=1.6 microns The dimensions noted above can be applied to the structures described in reference to FIGS. 4 and 5.

The processes and materials shown in U.S. Pat. No. 5,539,206, which is incorporated herein by reference, can be utilized to fabricate the detector array 20 as described herein.

Figure 5:
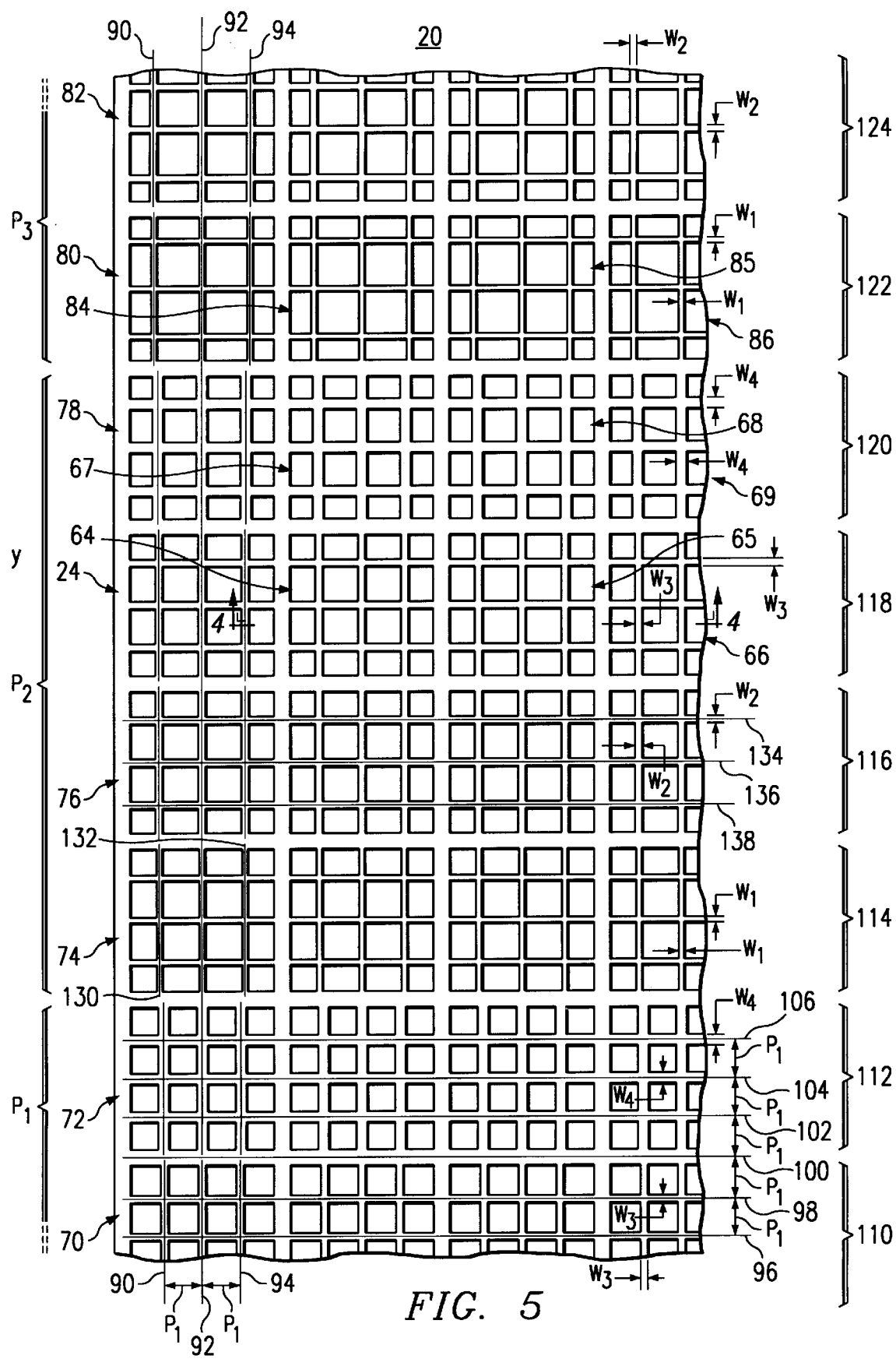
FIG. 5 is a plan view of a portion of a hyperspectral infrared detector corresponding to the configuration shown in FIG. 3.

Referring now to FIG. 5 there is illustrated a physical representation in a planar view for a portion of the detector array 20, which is shown schematically in FIG. 3. FIG. 5 illustrates a portion of the pitch regions $P_1$, $P_2$, and $P_3$. In addition to the detector 24, there are shown pixel detectors 64, 65, 66, 67, 68, 69, 70, 72, 74, 76, 78, 80, 82, 84, 85 and 86. The pitch distance $P_1$ is shown as the distance between adjacent ones of center lines 90, 92 and 94, as well as between the adjacent ones of center lines 96, 98, 100, 102, 104 and 106.

The detector array 20, as shown in FIG. 5, has rows 110, 112, 114, 116, 118, 120, 122 and 124 of detectors. Each of these rows has a common photodetector element width dimension for all the detectors within that row. For example, the row 112 of detectors has the width dimension $w_4$.

Further referring to FIG. 5, note that for each detector element the pitch is the same in both the x and y dimensions.

Further, note in this particular embodiment that in each column of detectors, there is a common center line throughout the entire column. The center line 92 extends vertically throughout the entire far left column in FIG. 5. Although this is present in the preferred embodiment, it is not necessary for practicing the invention.

The detector elements for each detector shown in the embodiment of FIG. 5 have a 4×4 space configuration. However, other configurations, including square, rectangular and otherwise, are also possible. The number of spaces in a detector can also differ. The number of elements in a detector depends on the overall area of a detector and the pitch of the elements. A 4×4 configuration is shown for each case of illustration. Preferred configurations have greater numbers of elements, such as 8×8.

Detector 76 has vertical center lines 130 and 132 in addition to line 92. The pitch $P_2$ is the distance between lines 130 and 92, as well as between 92 and 132. Similarly, for center lines 134, 136 and 138 the pitch $P_2$ is the distance between lines 134 and 136 and between lines 136 and 138. Detector 76 has the same pitch ($P_2$) for both the vertical and horizonal elongate photodetector elements.

Referring now to FIGS. 3, 4 and 5, the primary wavelength band of response for a particular detector can be varied by selecting the pitch distance between detector elements and by selecting the width of the detector elements. By stepping the pitch to greater values from one pitch segment ($P_1$, $P_2$, $P_3$, $P_4$) to the next, and by varying the width within each pitch segment, the principle band of radiation sensitivity can be shifted progressively so that a substantial portion of a particular spectrum can be collected and each band of information analyzed individually. This is shown in FIG. 4.

Figure 6:
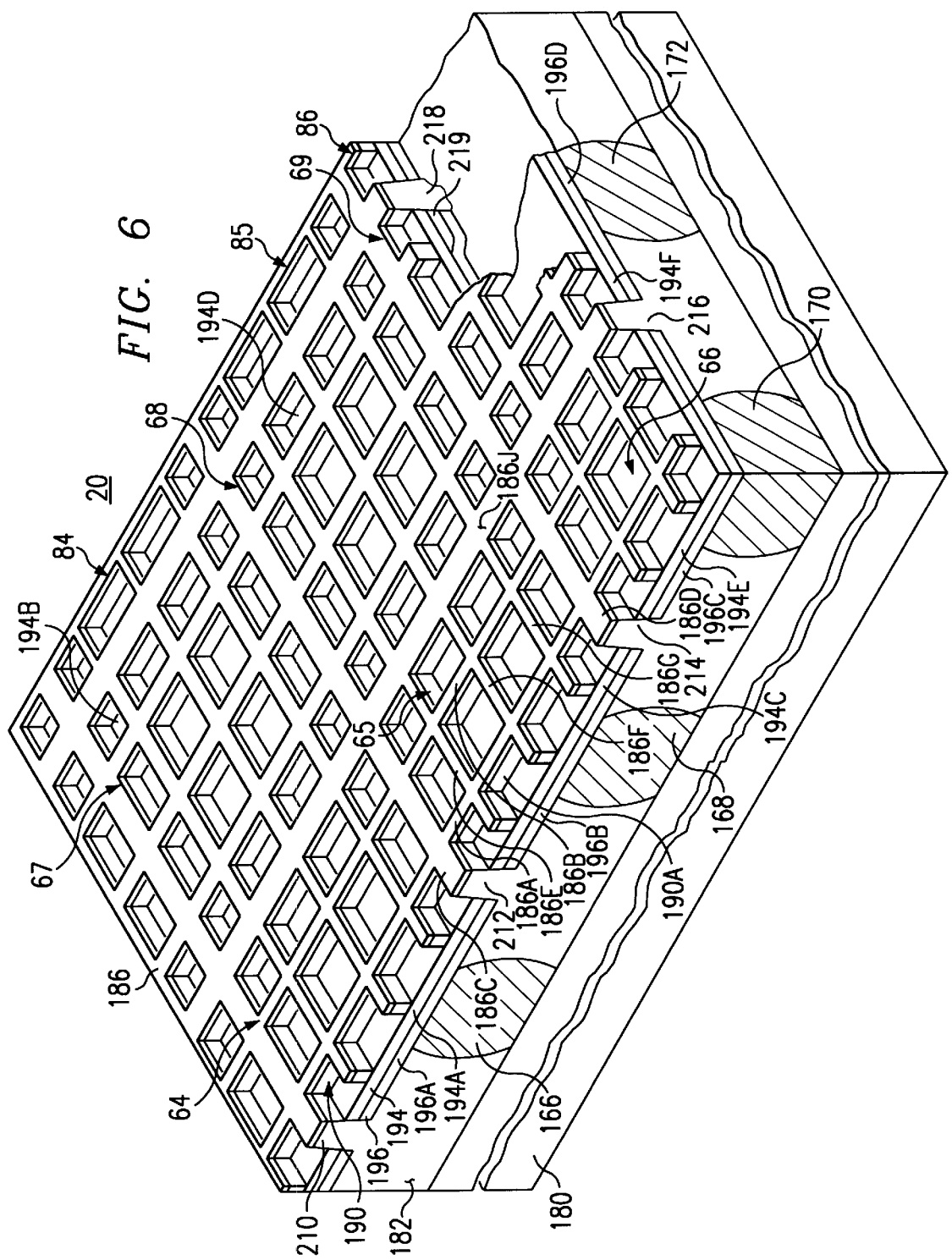
FIG. 6 is a perspective, cutaway view of a portion of a hyperspectral infrared detector focal plane array in accordance with the present invention.

Further referring to FIG. 6, the detector array 20 includes In bumps for each of the detectors. As shown, there are In bumps 166, 168, 170 and 172, respectively, for the detectors 64, 65, 66 and 69. These In bumps provide an electrical connection to transfer the signal from each of the detectors to an adjacent processing circuit. Such processing circuit comprises a read out integrated circuit (ROIC) 180. Such an ROIC is known in the art.

A wicked epoxy 182 surrounds the In bumps and bonds the integrated circuit structure which includes the detectors to the ROIC 180.

The upper surface of the array 20 comprises an etched layer of an $n^+$GaAs Contact 186. The etching produces elongate (strip) segments including 186A and 186B which extend between wider elongate $n^+$GaAs conductor contacts 186C and 186D. Additional elongate segments in the detector 65 include segment contacts 186E, 186F and 186G. The segments 186E–186G are each connected at a common end to a wide $n^+$GaAs conductor contact 186J and a similar conductor contact (not shown) at the opposite side of the detector 65. For each of the detectors, there is located immediately below the contact 186, a diffractive MQW structure 190 which has a segment beneath each of the contact 186 segments. The configuration of the MQW structure 190 is described in detail in U.S. Pat. No. 5,539,206, which is incorporated by reference herein.

The elongate element 190A is positioned immediately below contact 186A. In a similar fashion there is an elongate MQW structure positioned beneath each one of the segments of contact 186.

Each of the detectors shown in FIG. 6 has a lower (second) contact comprising a portion of a layer 194. The detectors 64, 67, 65, 68, 66 and 69 have respective lower contacts 194A, 194B, 194C, 194D, 194E and 194F. The lower contact is $n^+$GaAs for the particular described embodiment.

A layer for a contact/reflector 196 is positioned at a lower location for each of the detectors. The portion of the reflector within each detector is physically and electrically in contact with the corresponding In bump. The detectors 64, 65, 66 and 69 have corresponding reflectors 196A, 196B, 196C and 196D. These contacts/reflectors are preferably made of Au and have a preferred thickness of approximately 2,000 angstroms. Slots 210, 212, 214, 216 and 218 are etched into the structure of a detector 20 to electrically isolate each detector structure from the other. Each of these slots extends upward from the region occupied by the In bumps up to the lower surface of the contact 186. These slots are filled with the epoxy 182, which is electrically nonconductive. Each of the detectors, such as 64, 65, 66, 67, 68 and 69 has generally at the base of one corner section thereof a rectangular, planar ohmic contact, such as ohmic contact 219 shown for detector 69. The ohmic contact 219 is made preferably of Au/Ge and is positioned between the lower n+GaAs contact 194F and the Au reflector 196D. The ohmic contact 219 provides an ohmic connection between the n+GaAs contact 194F and the reflector 196D. A similar ohmic contact is provided at a similar location in each of the other detector structures. Each contact/reflector, such as 196D functions as an infrared radiation reflector.

Figure 7:
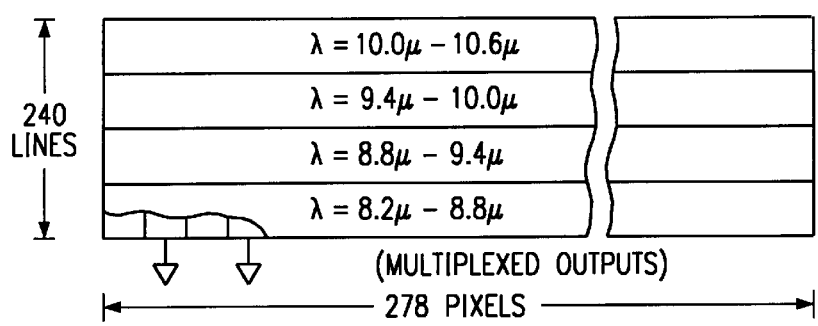
FIG. 7 is a schematic illustration of an alternative configuration for a hyperspectral infrared detector in accordance with the present invention.

Referring to FIG. 7, there is illustrated a sensor 300 in accordance with the present invention. As with the detector 20 shown in FIG. 3, the detector 300 is sensitive to four separate bands of infrared radiation. These are the bands 8.2–8.8 microns, 8.8–9.4 microns, 9.4–10.0 microns and 10.0–10.6 microns. The configuration of the sensor 300 has a total of 240 lines vertically with 60 lines per band. In the horizontal dimension, there are 278 pixels. Thus, in total, the sensor 300 has 66,720 pixels.

Figure 8:
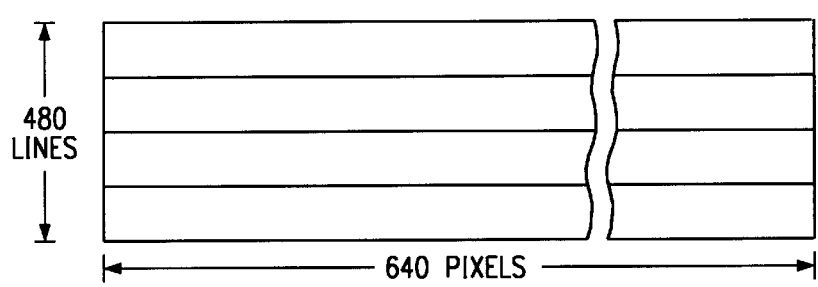
FIG. 8 is a schematic illustration of an alternative configuration for a hyperspectral infrared detector in accordance with the present invention.

A further configuration in accordance with the present invention is a sensor 320 shown in FIG. 8. The sensor 320 has the same four bands of radiation sensitivity as shown for the sensor 300 in FIG. 7, but has a greater resolution. The sensor 300 has 480 lines vertically with 120 lines per band, and has 640 horizontal pixels. This results in a total of 307,200 pixels.

Figure 9:
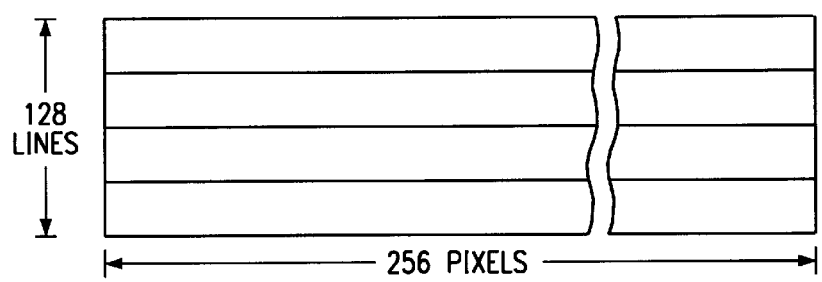
FIG. 9 is a schematic illustration of an alternative configuration for a hyperspectral infrared detector in accordance with the present invention.

A still further configuration which is applicable to the present invention is a sensor 340 illustrated in FIG. 9. This sensor likewise has the same four bands of radiation sensitivity as shown for the sensor 300 illustrated in FIG. 7. The sensor 340 has 128 lines in the vertical dimension with 32 lines per band. In the horizontal dimension, the sensor 340 has 256 pixels. This results in a total of 32,768 pixels.

Figure 10:
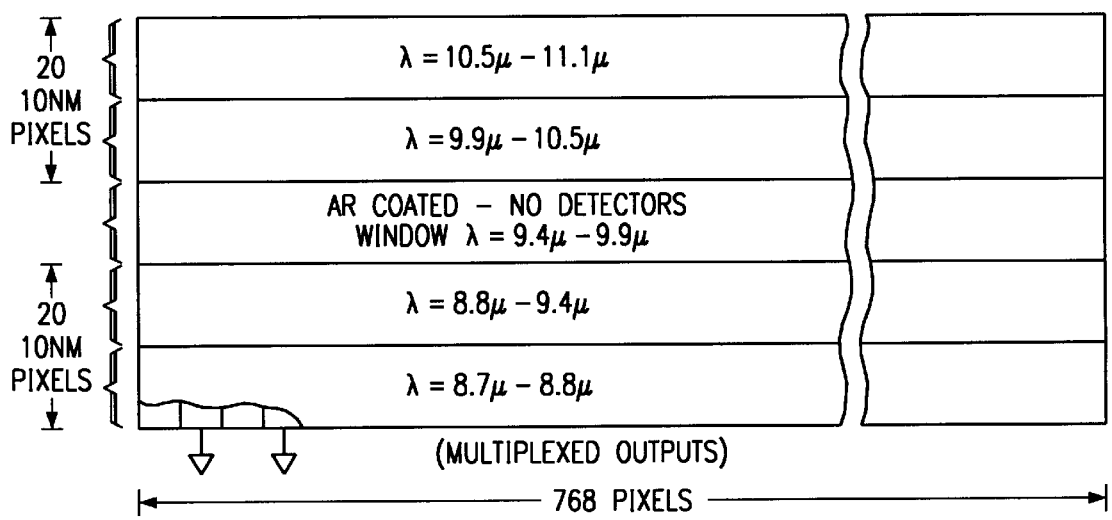
FIG. 10 is a further configuration of a hyperspectral detector in accordance with the present invention, but which includes a central portion with an anti-reflective coating.

A still further embodiment of the present invention for an infrared sensor is shown in FIG. 10 as sensor 360. This sensor has five segments horizontally, but the center section does not detect radiation, instead it is provided with an anti-reflective (AR) coating to prevent the reflection of radiation. This creates a "window" band of radiation that is not detected. The bands of radiation that are received are 8.7–8.8 microns, 8.8–9.4 microns, a non-received window of 9.4–9.9 microns, further received bands of 9.9–10.5 microns and 10.5–11.1 microns. Each of the grouped bands, the lower group and the upper group, has twenty pixels with each pixel corresponding to a particular ten nanometer band of infrared radiation. The sensor 360 has a horizontal width of 768 pixels.

The sensors 300, 320, 340 and 360 described above can be fabricated in the same manner as shown for detector 20 illustrated in FIG. 3. As shown in FIGS. 3, 7, 8 and 9, the present invention for a hyperspectral infrared sensor can be configured in many ways as needed by particular applications and regarding factors such as resolution, cost and primary spectral bands of interest.

Although several embodiments of the invention have been illustrated in the accompanying drawings and described in the foregoing Detailed Description, it will be understood that the invention is not limited to the embodiments disclosed, but is capable of numerous rearrangements, modifications and substitutions without departing from the scope of the invention.

What is claimed is:

1. A hyperspectral quantum well infrared radiation photodetector, comprising:

an array of detectors, said array having an x-dimension (rows) and a y-dimension (columns), wherein the detectors in each said row have a common wavelength band of infrared radiation response and said detectors in each said column have multiple wavelength bands of infrared radiation response, each said detector comprising a plurality of elongate, multiple quantum well infrared radiation absorbing elements, each element having a width dimension and adjacent ones of said elements are separated by a pitch dimension, and each of said elements having first and second opposite longitudinal surfaces, each of said columns having detectors therein with different width dimensions and detectors therein with different pitch dimensions, whereby the detectors in each of said columns have multiple wavelength bands of infrared radiation response, and said detectors in each of said rows have common width and pitch dimensions, whereby the detectors in each said row have a common wavelength band of infrared radiation response, said multiple quantum well infrared elements comprising a diffraction grating for said infrared radiation, a first contact for each said detector, said first contact having a plurality of planar electrically interconnected strips respectively in contact with and extending along said first surfaces of said multiple quantum well elements, a second contact for each said detector, said second contact electrically connected to said second surfaces of said multiple quantum well elements, said first contact and said second contact of each said detector positioned on opposite sides of said multiple quantum well elements to provide current flow through said elements in a direction substantially transverse to the axis of each of said elements, and a planar reflector for said infrared radiation, said reflector positioned on an opposite side of said second contact from said multiple quantum well elements.

2. A hyperspectral quantum well infrared radiation photodetector as recited in claim 1 wherein said elongate radiation absorbing elements comprise a first set of said elements which are parallel to each other and a second set of said elements which are parallel to each other and are transverse to the elements of said first set.

3. A hyperspectral quantum well infrared radiation photodetector as recited in claim 1 wherein said rows of said detectors are divided into segments each including a plurality of said rows and the detectors in each segment have a common pitch dimension which is different from the pitch dimension of the detectors in the others of said segments.

4. A hyperspectral infrared radiation photodetector system comprising:

an optical train for collecting said infrared radiation, a disperser for separating said infrared radiation into its spectral components, a focal plane array for receiving the spectral components of said infrared radiation, said focal plane array comprising, an array of detectors, said array having an x-dimension (rows) and a y-dimension (columns), wherein the detectors in each said row have a common wavelength band of infrared radiation response and said detectors in each said column have multiple wavelength bands of infrared radiation response, each said detector comprising a plurality of elongate, multiple quantum well infrared radiation absorbing elements, each element having a width dimension and adjacent ones of said elements are separated by a pitch dimension, and each of said elements having first and second opposite longitudinal surfaces, each of said columns having detectors therein with different width dimensions and detectors therein with different pitch dimensions, whereby the detectors in each said columns have multiple wavelength bands of infrared radiation response, and said detectors in each of said rows have common width and pitch dimensions, whereby the detectors in each said row have a common wavelength band of infrared radiation response, said multiple quantum well infrared elements comprising a diffraction grating for said infrared radiation, a first contact for each said detector, said first contact having a plurality of planar electrically interconnected strips respectively in contact with and extending along said first surfaces of said multiple quantum well elements, a second contact for each said detector, said second contact electrically connected to said second surfaces of said multiple quantum well elements, said first contact and said second contact of each said detector positioned on opposite sides of said multiple quantum well elements to provide current flow through said elements in a direction substantially transverse to the axis of each of said elements, a planar reflector for said infrared radiation, said reflector positioned on an opposite side of said second contact from said multiple quantum well elements, and a plurality of electrical interconnects in contact with said contacts for conveying signals corresponding to said spectral components of said infrared radiation, and a processor connected to receive said signals from said focal plane array.

5. A hyperspectral infrared radiation photodetector system as recited in claim 4 wherein said disperser is an optical grating.

6. A hyperspectral infrared radiation photodetector system as recited in claim 4 wherein said disperser is a prism.

* * * * *